United States Patent [19]

Cambou

[11] Patent Number: 5,070,382
[45] Date of Patent: Dec. 3, 1991

[54] SEMICONDUCTOR STRUCTURE FOR HIGH POWER INTEGRATED CIRCUITS

[75] Inventor: Bertrand Cambou, Mesa, Ariz.

[73] Assignee: Motorola, Inc., Schaumburg, Ill.

[21] Appl. No.: 395,695

[22] Filed: Aug. 18, 1989

[51] Int. Cl.$^5$ .................. H01L 27/02; H01L 27/04
[52] U.S. Cl. ............................ 357/48; 357/43; 357/90
[58] Field of Search ............... 357/48, 90, 43

[56] References Cited

U.S. PATENT DOCUMENTS 4,831,430 6/1989 Umeji .......................... 357/48

FOREIGN PATENT DOCUMENTS 0285750 12/1986 Japan ......................... 357/48
0010658 1/1989 Japan ......................... 357/48

Primary Examiner—Rolf Hille
Assistant Examiner—Wael Fahmy
Attorney, Agent, or Firm—Joe E. Barbee; Miriam Jackson

[57] ABSTRACT

A semiconductor structure for high power integrated circuits is fabricated having a substrate, a first and second epitaxial layer, each having a patterned buried layer, and a third epitaxial layer in which power, logic and analogic devices are formed. The power device is formed in an isolated region of the third epitaxial layer over the buried layers, which provide for good electrical contact to the back of the substrate. The analogic and logic devices are formed in the third epitaxial layer outside the isolated region of the power device. The thickness of the first and second epitaxial layers reduces the NPN parasitic transistor effect. The first epitaxial layer may be fabricated with a lower resistivity to further reduce the parasitic NPN transistor effect. The second epitaxial layer can be of a higher resistivity in order to reduce autodoping of the third epitaxial layer.

14 Claims, 2 Drawing Sheets

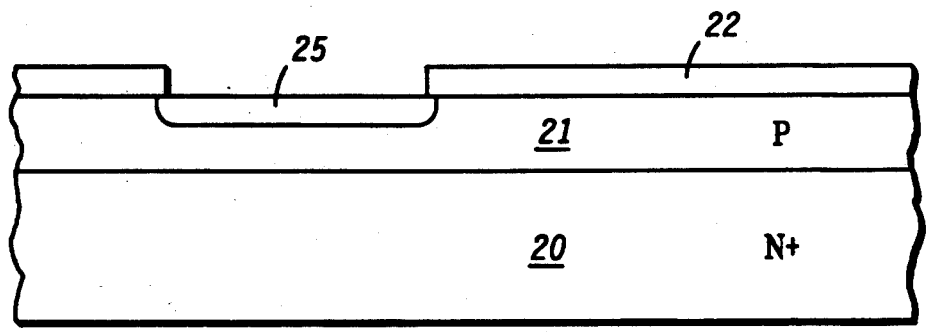
FIG. 1
FIG. 2
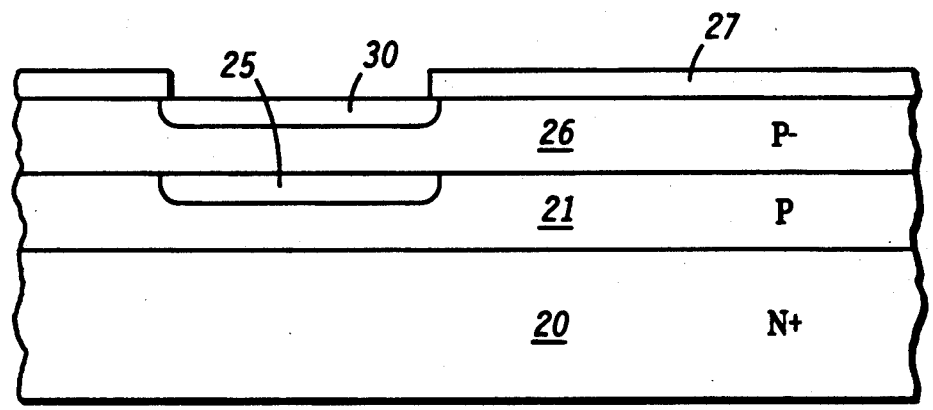

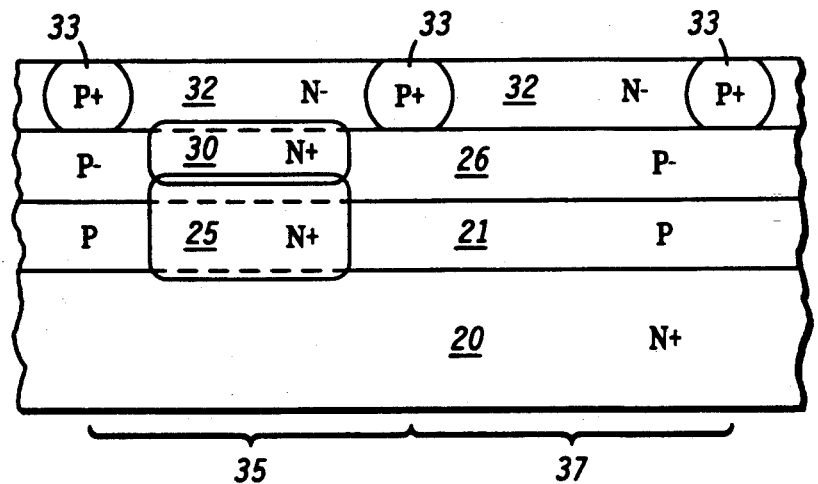
FIG. 3
FIG. 4
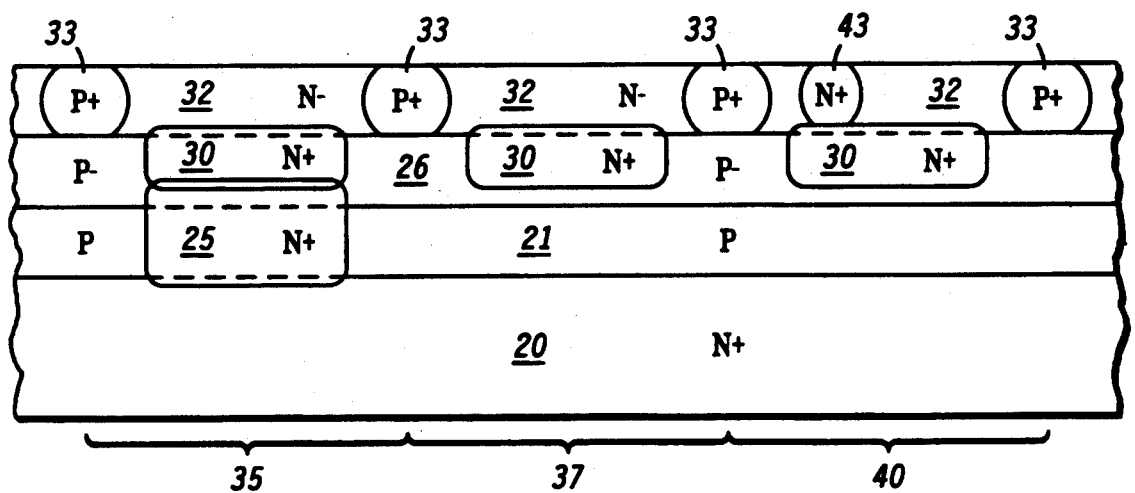

SEMICONDUCTOR STRUCTURE FOR HIGH POWER INTEGRATED CIRCUITS

BACKGROUND OF THE INVENTION

This invention relates, in general, to semiconductor devices, and more particularly, to a process of fabricating a semiconductor structure for high power integrated circuits.

High power integrated circuits having both low voltage and power transistors, such as logic or analog circuits and power MOSFETs or bipolar transistors, can be fabricated by isolating regions in a semiconductor epitaxial layer on a substrate. Presently, techniques for isolating the logic devices from the power device include buried layer structures and etch refill structures. A buried layer structure disclosed in Japanese Patent Publication No. 61-285750, published on Dec. 16, 1986, comprises an N+ type substrate in which an N+ patterned buried layer is formed. A P-type epitaxial is grown on the substrate, in which a second N+ patterned buried layer is then formed. An N-type epitaxial layer is formed on the P-type epitaxial layer. In the N-type epitaxial layer, P+ patterned isolation regions are formed surrounding the buried layer and diffused down to the P-type epitaxial layer. The isolated region over the N+ buried layer is where the power device is formed, and the isolated region over the P-type epitaxial layer is where the logic devices are formed. A third N+ patterned buried layer is also formed below the logic device area. The third N+ buried layer must be formed separately from the second N+ buried layer because the diffusion depth of the third N+ buried layer must be kept low in order not to destroy the isolation. This buried layer structure is undesirable because the parasitic NPN transistor formed under the logic device area has a tendency to turn on at low voltage. To reduce the effect of the parasitic NPN transistor, the thickness or the doping concentration of the P-type epitaxial layer, the base of the parasitic NPN transistor, can be increased. An increase in the thickness or the doping concentration of a base of an NPN transistor makes a poor transistor, which is desirable in this case. However, in the buried layer structure of the prior art, the thickness of the P-type epitaxial layer can not be increased more than the length of the vertical diffusion of the N+ buried layer. This is because the N+ buried layer must make contact with the N+ substrate and the N-type epitaxial layer. In addition, if the P-type epitaxial layer has a high doping concentration, the resistivity of the N-type epitaxial layer is difficult to control due to autodoping.

An etch refill structure consists of an N+ substrate layer that has been etched to form wells therein. Subsequently, a P-type epitaxial layer is formed on the surface and in the wells of the N+ substrate. The structure is then ground and polished, such that the P-type epitaxial layer is left only in the wells of the N+ substrate. Then, an N type epitaxial layer is formed on the surface of the substrate and the P-type epitaxial layer. P+ patterned isolation regions are formed in the N-type epitaxial layer surrounding the N+ substrate and diffused down to the P-type epitaxial layer. The power and logic devices are built in the same manner as in the buried layer structure. The etch refill structure may be undesirable if polishing equipment is not readily available. Therefore, it would be desirable to provide a semiconductor structure which will reduce the NPN parasitic transistor effect which can be easily fabricated at a low cost, and provide for better device performance.

Accordingly, it is an object of the present invention to provide a semiconductor structure for high power integrated circuits which reduces the NPN parasitic transistor effect.

Another object of the present invention is to provide a semiconductor structure for high power integrated circuits which can be easily fabricated at a low cost and better manufacturability.

An additional object of the present invention is to provide a semiconductor structure which provides for better device performance of high power integrated circuits.

SUMMARY OF THE INVENTION

The above and other objects and advantages of the present invention are achieved by providing a semiconductor structure comprised of a substrate, a first and second epitaxial layer, each having a buried layer, and a third epitaxial layer in which power and logic or analog devices are formed. The total thickness of the first and second epitaxial layers reduces the NPN parasitic transistor effect. The first epitaxial layer may be fabricated with a lower resistivity, which will further reduce the NPN parasitic transistor effect. In addition, the second epitaxial layer may be fabricated with a high resistivity to reduce autodoping of the third epitaxial layer. The double buried layer will provide for a good electrical contact for the power device. This substrate provides for better device performance, better manufacturability and low cost fabrication.

BRIEF DESCRIPTION OF DRAWINGS

FIGS. 1-3 illustrate enlarged, cross-sectional views of a portion of a semiconductor substrate in various stages representing a first embodiment of the present invention; and FIG. 4 illustrates an enlarged, cross-sectional view of a portion of a semiconductor substrate representing a second embodiment of the present invention.

DETAILED DESCRIPTION OF INVENTION

FIG. 1 illustrates an enlarged, cross-sectional view of a portion of an N-type semiconductor substrate 20 having a P-type epitaxial layer 21 formed on the surface. An N-type dopant is then introduced into a selected portion of P-type epitaxial layer 21 to form an N-type buried layer 25. The portion of P-type epitaxial layer 21 is selected by using a mask 22 and standard photolithography and etch processes. In a preferred embodiment, mask 22 is comprised of an oxide layer and a nitride layer. N-type buried layer 25 can be formed by a predeposition and diffusion method or an ion implantation method. A heavy dose of antimony is the N-type dopant preferably used to form N-type buried layer 25, because antimony does not exhibit much autodoping during subsequent epitaxial growth. However, other N-type dopants such as arsenic and phosphorous may be used. In one embodiment of the present invention, the dopant concentration of P-type epitaxial layer 21 is approximately $6 \times 10^{15}$ atoms/cm$^3$.

FIG. 2 illustrates the structure of FIG. 1 further along in the process. First, mask 22 is removed from the surface of P-type epitaxial layer 21. P-type epitaxial layer 26 is formed on the surface of epitaxial layer 21 and then N-type dopants are introduced into a selected portion of P-type epitaxial layer 26 to form N-type buried layer 30. N type buried layer 30 is formed in the same manner as N-type buried layer 25, using a mask 27 to selectively dope P-type epitaxial layer 26. However, mask 27 could be different than the mask 22 in cases where a special device, such as an updrain transistor is to be formed (see FIG. 4). The dopant concentration of P-type epitaxial layer 26 is preferably lower than the dopant concentration of P-type epitaxial layer 21. In one embodiment, the dopant concentration of P-type epitaxial layer 26 is approximately $1 \times 10^{15}$ atoms/cm$^3$. The advantages resulting from using two P-type epitaxial layers 21 and 26 will be made more apparent below.

FIG. 3 illustrates the structure of FIG. 2 further along in the process. First, mask 27 is removed. N-type buried layers 25 and 30 are then diffused such that the interface of each region overlaps each other, and N-type buried layer 25 overlaps substrate 20. The thickness of P-type epitaxial layers 21 and 26 are thus determined by the up-diffusion and down-diffusion of N-type buried layers 25 and 30. For example, if N-type buried layers 25 and 30 are doped with antimony, each N-type buried layer 25 and 30 will diffuse downward approximately 13 microns from the surface of the P-type epitaxial layer 21 and 26, respectively. In addition, N-type buried layer 25 diffuses upward approximately 7 microns, and N-type substrate layer 20 diffuses upward approximately 7 microns. Thus, epitaxial layers 21 and 26 cannot be greater than approximately 20 microns, the addition of the up-diffusion and down-diffusion, in order for N-type buried layers 25 and 30 to overlap. The thickness of P-type epitaxial layers 21 and 26 would be different if other N-type dopants which diffuse faster, such as arsenic or phosphorous, are used. A typical diffusion cycle for N-type buried layers 25 and 30 is approximately eight to ten hours at 1250° C. After the N-type buried layer diffusion cycle, an N-type epitaxial layer 32 is formed on the surface of P-type epitaxial layer 26 and N-type buried layer 30. Subsequently, P-type isolation regions 33 are formed surrounding N-type buried layers 25 and 30 and then diffused through N-type epitaxial layer 32 to make contact with P-type epitaxial layer 26. After isolation regions 33 are formed, N-type buried layer region 30 diffuses slightly into N-type epitaxial layer 32. The resistivity and thickness of N type epitaxial layer 32 is chosen accordingly to optimize the electrical characteristics of the semiconductor devices built therein. Typically, a power device, such as a power MOSFET or a bipolar transistor (not shown) is fabricated in N-type epitaxial layer 32 over N-type buried layers 25 and 30, shown by bracket 35. A dense circuit, such as CMOS logic circuit or analog device (not shown), is fabricated in N-type epitaxial layer 32 over P-type epitaxial layers 21 and 26, shown by bracket 37.

Both N-type buried layers 25 and 30 will act as good conductive layers between N+ substrate 20 and N-type epitaxial layer 32 to provide for a low resistance of the power device. The present invention reduces the likelihood that a parasitic NPN transistor, formed by N-type epitaxial layer 32 (the emitter), P-type epitaxial layers 21 and 26 (the base), and N+ substrate 20 (the collector) will turn on. By using two P-type epitaxial layers 21 and 26, the thickness of the P-type base of the parasitic NPN transistor can be increased to reduce the effect of the vertical parasitic NPN transistor. To prevent the parasitic NPN transistor from turning on in higher voltage devices, the thickness of P-type eitaxial layers 21 and 26 must be greater than in the lower voltage devices. Thus, using only one P-type epitaxial layer, as is done in the prior art, would not be sufficient to prevent the vertical NPN transistor from turning on, because its thickness is limited by a single buried layer diffusion. In addition, P-type epitaxial layer 21 can be fabricated with a low resistivity, or high dopant concentration, which will further reduce the effect of the vertical parasitic NPN transistor located in dense circuit area 37. P-type epitaxial layer 26 can be fabricated with a high resistivity, or low dopant concentration, which will help to better control the formation of N-type epitaxial layer 32 by reducing the autodoping problems. In the present invention, if a greater thickness of P-type epitaxial layers 21 and 26 is desirable, a third P-type epitaxial layer (not shown) having an N-type buried layer could be further formed before N-type epitaxial layer 32 is formed. Note that each layer can be fabricated having an opposite conductivity type of what is shown, in order to fabricate a P-channel power device.

FIG. 4 illustrates a second embodiment of the present invention. Device region 35 and 37 are the same as shown in FIG. 3, except that a second N+ buried layer 30 is formed in P-type epitaxial layer 26. A third N+ buried layer 30 is also formed in a device region 40. FIG. 4 illustrates how forming more than one N+ buried layer 30 may be utilized. Layer 27, illustrated in FIG. 2, can be patterned to form more than one N+ buried layer 30 in P-type epitaxial layer 26 at the same time, thus another masking layer is not required. This can be done because two P-type epitaxial layers 21 and 26 are formed. If only one P-type epitaxial layer is formed, N+ buried layers 30 in device regions 37 and 40 may diffuse to N+ substrate 20, thus destroying the isolation of the device region 35 from device regions 37 and 40. Logic or analog circuits (not shown) can be formed in N+ epitaxial layer 32 in device region 37. N+ buried layer 30 in device region 37 will help to further reduce the autodoping of N-type epitaxial layer 32. In device region 40, a bipolar transistor or an updrain power MOSFET (not shown) can be formed. A masking and diffusion step, which is well known in the art, would be needed to form N+ collector or updrain region 43. N+ buried layer 30 in device region 40 is part of the collector or drain of the device formed. Those skilled in the art can readily recognize that variations of the two embodiments shown in FIGS. 3 and 4 are also desirable.

By now it should be appreciated that there has been provided a new and improved semiconductor structure for high power integrated circuits. The structure of the present invention can be fabricated at low cost and better manufacturability to obtain improved device performance.

I claim:
1. A semiconductor structure, comprising:
   a substrate of a first conductivity type;
   a first epitaxial layer of a second conductivity type, disposed on the substrate and having a first buried layer of a first conductivity type;
   a second epitaxial layer of a second conductivity type, disposed on the first epitaxial layer and having a second buried layer of a first conductivity type which is formed over the first buried layer; and
   a third epitaxial layer of a first conductivity type disposed on the second epitaxial layer, and having isolation regions extending down to the second epitaxial layer, and surrounding the first and the second buried layers.

2. The semiconductor structure of claim 1, wherein the second epitaxial layer is of a higher resistivity than the first epitaxial layer.

3. The semiconductor structure of claim 1, wherein the first conductivity type is N-type.

4. The semiconductor structure of claim 1, wherein the first and the second buried layers are doped with antimony.

5. The semiconductor structure of claim 1, further comprising:
   at least a third buried layer of a first conductivity type which is formed in the second epitaxial layer adjacent the second buried layer.

6. The semiconductor structure of claim 1, further comprising:
   at least a fourth epitaxial layer of a second conductivity type disposed between the second and the third epitaxial layers, and having a fourth buried layer of a first conductivity type formed over the second buried layer.

7. The semiconductor structure of claim 1, further comprising:
   a power device fabricated in the third epitaxial layer over the first and the second buried layers, and a logic device fabricated in the third epitaxial layer, wherein the logic device is isolated from the power device by the isolation regions.

8. A semiconductor structure, comprising:
   a substrate of a first conductivity type;
   a first epitaxial layer of a second conductivity type disposed on the substrate;
   a second epitaxial layer of a second conductivity type disposed on the first epitaxial layer;
   a third epitaxial layer of a first conductivity type disposed on the second epitaxial layer;
   a first buried layer of a first conductivity type extending from the substrate to the second epitaxial layer;
   a second buried layer of a first conductivity type extending from the second epitaxial layer to the third epitaxial layer, wherein the first and the second buried layers overlap; and
   isolation regions of a second conductivity type extending through the third epitaxial layer to make contact with the second epitaxial layer and surrounding the first and second buried layers.

9. The semiconductor structure of claim 8, wherein the second epitaxial layer is of a higher resistivity than the first epitaxial layer.

10. The semiconductor structure of claim 8, wherein the first conductivity type is N-type.

11. The semiconductor structure of claim 8, wherein the first and the second buried layers are doped with antimony.

12. The semiconductor structure of claim 8, further comprising:
   at least a fourth epitaxial layer of a second conductivity type disposed between the second and the third epitaxial layers, and having a third buried layer of a first conductivity type.

13. The semiconductor structure of claim 8, further comprising:
   a power device fabricated in the third epitaxial layer over the first and the second buried layers, and a logic device fabricated in the third epitaxial layer, wherein the logic device is isolated from the power device by the isolation regions.

14. The semiconductor structure of claim 10, wherein the first epitaxial layer is of a doping concentration of approximately $6 \times 10^{15}$ atoms/cm$^3$, and the second epitaxial layer is of a doping concentration of approximately $1 \times 10^{15}$ atoms/cm$^3$.

* * * * *